United States Patent
Han et al.

(10) Patent No.: US 7,993,417 B2
(45) Date of Patent: Aug. 9, 2011

(54) METHOD OF ADHERING A PAIR OF MEMBERS

(75) Inventors: Chul-Jong Han, Anyang-si (KR); Yoon-Jae Chung, Anyang-si (KR); Jong-Yoon Jang, Anyang-si (KR); Jeong-Beom Park, Anyang-si (KR); Yong-Seok Han, Anyang-si (KR); Sung-Uk Choi, Anyang-si (KR); Il-Rae Cho, Anyang-si (KR); Hyuk-Soo Moon, Anyang-si (KR); Kyung-Joon Lee, Anyang-si (KR)

(73) Assignee: LS Cable Ltd. (KR)

( * ) Notice: Subject to any disclaimer, the term of this patent is extended or adjusted under 35 U.S.C. 154(b) by 376 days.

(21) Appl. No.: 12/161,487

(22) PCT Filed: Jan. 22, 2007

(86) PCT No.: PCT/KR2007/000355
§ 371 (c)(1),
(2), (4) Date: Jul. 18, 2008

(87) PCT Pub. No.: WO2007/083963
PCT Pub. Date: Jul. 26, 2007

(65) Prior Publication Data
US 2009/0000807 A1    Jan. 1, 2009

(30) Foreign Application Priority Data
Jan. 20, 2006  (KR) .................. 10-2006-0006347

(51) Int. Cl.
*H01L 21/00* (2006.01)

(52) U.S. Cl. ............. 29/25.01; 29/825; 29/832; 29/833; 29/840; 438/612

(58) Field of Classification Search ................. 29/25.01, 29/825, 832, 833, 840; 438/612
See application file for complete search history.

(56) References Cited

U.S. PATENT DOCUMENTS

| | | | |
|---|---|---|---|
| 5,605,547 A * | 2/1997 | Lake | 29/25.01 |
| 6,410,415 B1 * | 6/2002 | Estes et al. | 438/612 |
| 6,717,064 B1 * | 4/2004 | Kurita et al. | 174/259 |
| 6,853,087 B2 * | 2/2005 | Neuhaus et al. | 257/778 |
| 2002/0027294 A1 * | 3/2002 | Neuhaus et al. | 257/778 |

FOREIGN PATENT DOCUMENTS

| | | |
|---|---|---|
| JP | 06-271361 | 9/1994 |
| JP | 10-150266 A | 6/1998 |
| JP | 2001-047423 A | 2/2001 |
| KR | 10-2001-0093302 A | 10/2001 |

OTHER PUBLICATIONS

International Search Report, dated Apr. 17, 2007, issued in International Application No. PCT/KR2007/000355.

* cited by examiner

*Primary Examiner* — Carl Arbes
(74) *Attorney, Agent, or Firm* — Stroock & Stroock & Lavan LLP

(57) ABSTRACT

A connecting structure of PCB using an anisotropic conductive film according to the present invention having members connected to each other by heat-compression using the anisotropic conductive film including an insulating adhesive as a base material and conductive particles dispersed in the insulating adhesive, wherein at least any one of the members has a flexible property, and a surface roughness value (Ra) of the member having a flexible property is 0.1 to 5.0 μm due to dents formed by heat-compression.

4 Claims, 2 Drawing Sheets

[Fig. 1]
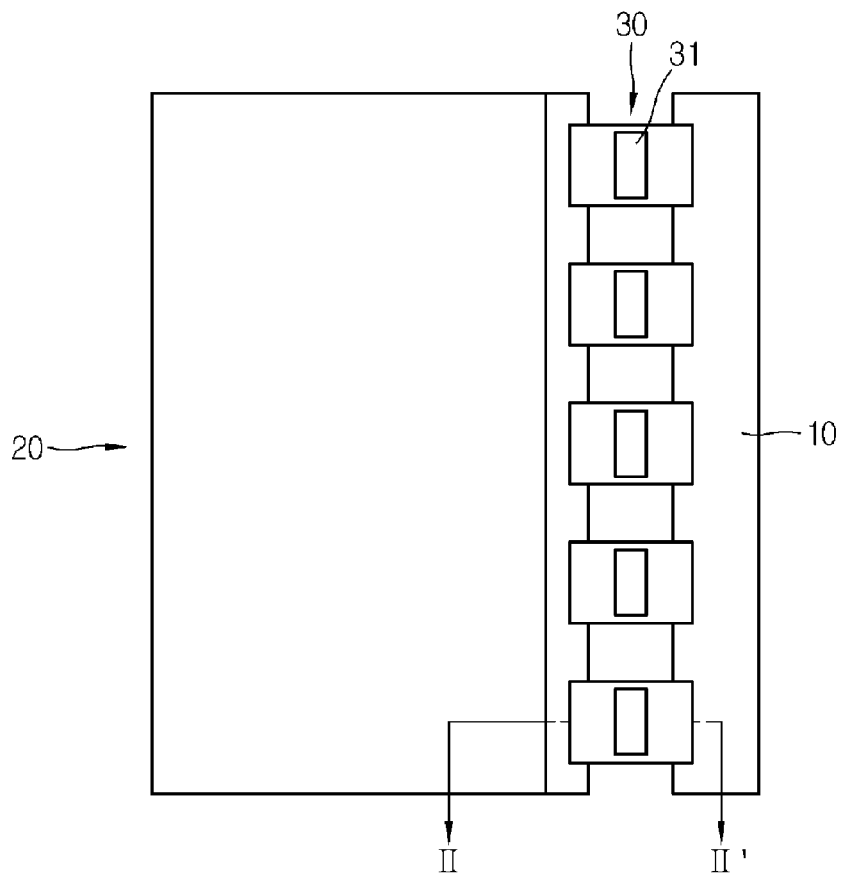
[Fig. 2]
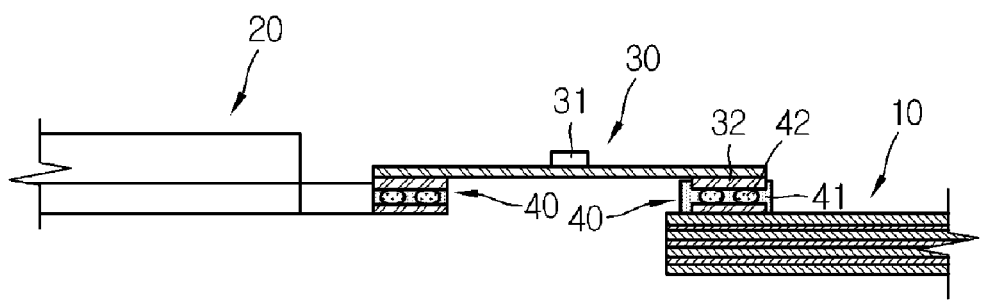
[Fig. 3]
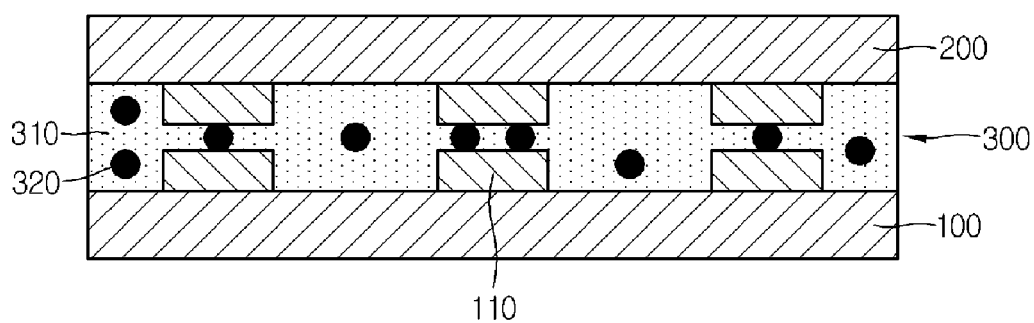

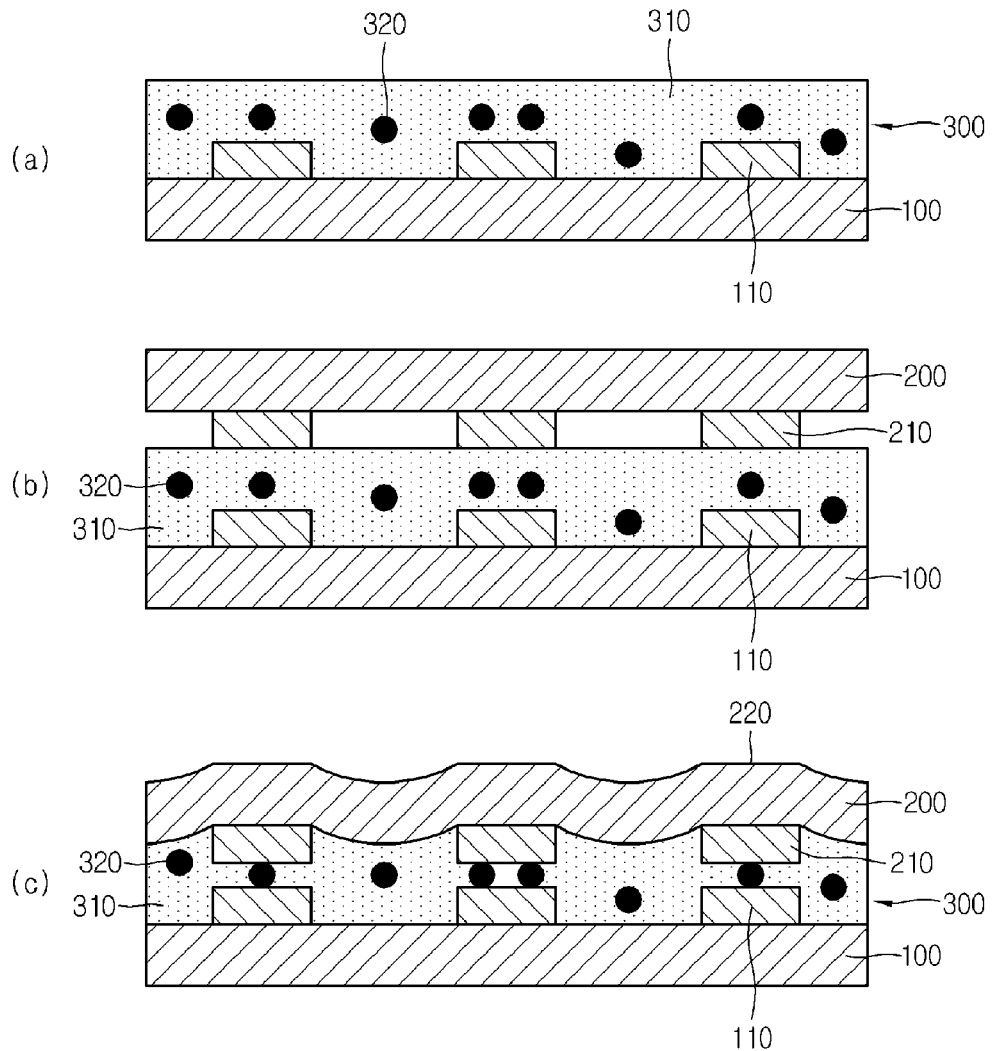
[Fig. 4]
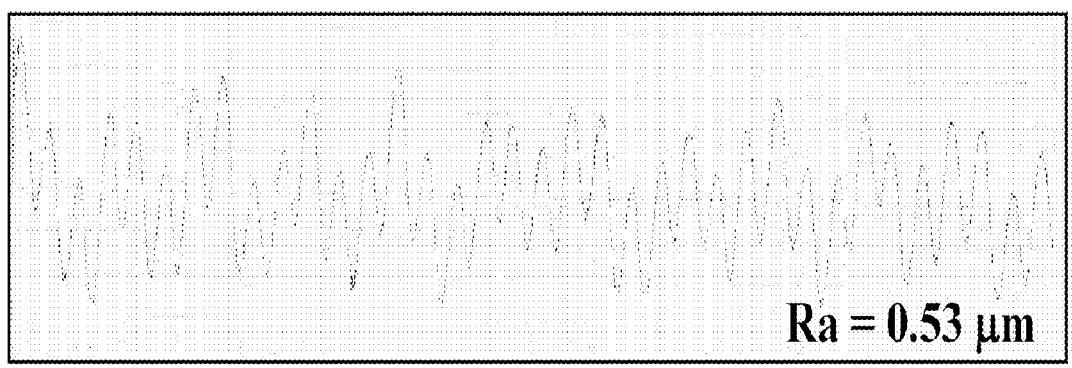
[Fig. 5]

METHOD OF ADHERING A PAIR OF MEMBERS

CROSS-REFERENCE TO RELATED APPLICATIONS

This application is a is a national stage application under 35 U.S.C. 371 based on and claiming the benefit of International Application Serial No. PCT/KR2007/000355 filed on Jan. 22, 2007 and the benefit of priority from Korean Application No. 10-2006-0006347 filed on Jan. 20, 2006, the entire contents of each of which are incorporated herein by reference.

TECHNICAL FIELD

The present invention relates to a connecting structure of PCB (Printed Circuit Board) using an anisotropic conductive film (ACF), and in particular, to a connecting structure of PCB using an anisotropic conductive film, which can easily check a connection state between electrodes of members when adhering to the members.

BACKGROUND ART

Generally, an ACF is a connecting material applied to the case that members can not be connected to each other by a soldering method as the members are made of special materials or have fine pitch signal wirings.

The ACF is typically used to package LCD panels, printed circuit boards (PCBs), driver IC circuits and so on in LCD modules.

For example, an LCD module has a plurality of driver ICs mounted thereon for driving thin film transistor (TFT) patterns. A method for mounting a driver IC on an LCD module mainly includes a chip on glass (COG) mounting method for mounting a driver IC on a gate area and a data area of an LCD panel without an additional structure, and a tape automated bonding (TAB) mounting method for indirectly mounting a driver IC on a gate area and a data area of an LCD panel through a tape carrier package (TCP) having the driver IC mounted thereon.

However, electrodes of the driver IC and electrodes of the LCD panel are arranged at fine pitches, and thus any mounting method has a difficulty in using a means such as soldering. For this reason, the ACF is generally used in electrically connecting the electrodes of the driver IC to the electrodes of the LCD panel.

FIG. 1 is a plane view of an LCD module using a typical TAB method, and FIG. 2 is a cross-sectional view taken along the line II-II' of FIG. 1. Referring to FIGS. 1 and 2, a PCB 10 is located in a row direction of an LCD panel 20 as a source for transmitting external signals to the LCD panel 20, and a TCP 30 having a drive IC 31 mounted thereon electrically connects the LCD panel 20 to the PCB 10. At this time, the ACF 40 is used in electrically connecting the LCD panel 20 to the TCP 30 and the TCP 30 to the PCB 10.

The ACF 40 includes an insulating adhesive and conductive particles dispersed in the insulating adhesive, and when the ACF 40 is interposed between the members and is compressed using heat, the conductive particles between opposite terminals come in contact with each other, and thus the opposite terminals are electrically connected to each other. At this time, insulation is sustained at an x-y plane and electrical connection is established in a z-axis direction. More specifically, referring to FIG. 2 taken along the line II-II' of FIG. 1, the ACF 40 is interposed between the TCP 30 and the PCB 10, which includes an insulating adhesive composition 41 and a plurality of conductive particles 42 dispersed in the insulating adhesive composition 41. Subsequently, when the anisotropic conductive film 40 is compressed using predetermined temperature and pressure, the conductive particles 42 interposed between electrodes 32 of the TCP 30 and electrodes 14 of the PCB 10 electrically connects the opposite electrodes 32 and 14. This connecting method is also applied to electrical connection between the TCP 30 and the LCD panel 20 in the same manner.

Meanwhile, it is general to observe cracks or pressed state of the conductive particles 42 using a microscope so as to check an electrical connection state of the members connected by the anisotropic conductive film 40.

However, this method requires a separate inspection step, thereby delaying a process, and has a limitation of inspecting only a restricted portion of a sample. And, because at least one substrate should have a transparent property to observe the pressed state of the conductive particles, the method has a limitation in wide application.

DISCLOSURE OF INVENTION

Technical Problem

The present invention is designed to solve the above-mentioned problems, and therefore it is an object of the present invention to provide a connecting structure of PCB using an anisotropic conductive film, which can easily evaluate a connection state of members having electrodes of fine pitch without a separate inspection step, and manufacturing method thereof and a connection state evaluating method.

Technical Solution

In order to achieve the above-mentioned objects, a connecting structure of PCB according to the present invention having first and second members adhered to each other using an anisotropic conductive film interposed therebetween and including an insulating adhesive as a base material and conductive particles dispersed in the insulating adhesive, wherein the first member has a flexible property relatively to the second member, and after the first member and the second member are adhered to each other by heat-compression, a surface roughness value (Ra) of dents formed on the surface of the first member is 0.1 to 5.0 µm.

Preferably, at least any one of the members is FPC (flexible printed circuit).

Meanwhile, a method for adhering to a pair of members according to the present invention includes (a) arranging an anisotropic conductive film including an insulating adhesive as a base material and conductive particles dispersed in the insulating adhesive, on one surface of a first member; (b) applying predetermined heat and pressure to heat-compress the anisotropic conductive film to the first member; (c) arranging a second member having a flexible property on a surface of the anisotropic conductive film opposite to the surface to which the first member is adhered; and (d) applying predetermined heat and pressure to heat-compress the anisotropic conductive film to the second member, and the step (d) includes controlling compression pressure, temperature and time such that a surface roughness value of dents formed on the surface of the second member is 0.1 to 5.0 µm.

And, a method for evaluating a connection state between members according to the present invention includes (a) arranging an anisotropic conductive film including an insulating adhesive as a base material and conductive particles dispersed in the insulating adhesive, on one surface of a first member; (b) applying predetermined heat and pressure to heat-compress the anisotropic conductive film to the first member; (c) arranging a second member having a flexible property on a surface of the anisotropic conductive film opposite to the surface to which the first member is adhered; (d) applying predetermined heat and pressure to heat-compress the anisotropic conductive film to the second member; and (e) measuring a surface roughness value of dents formed on the surface of the second member, wherein, when a surface roughness value is 0.1 to 5.0 μm, the connection state between the members is determined to be normal.

BRIEF DESCRIPTION OF THE DRAWINGS

The present invention will be more fully described in the following detailed description, taken accompanying drawings, however, the description proposed herein is just a preferable example for the purpose of illustrations, not intended to limit the scope of the invention. In the drawings:

FIG. 1 is a plane view of a conventional LCD module.

FIG. 2 is a cross-sectional view taken along the line II-II' of FIG. 1.

FIG. 3 is a cross-sectional view of a connecting structure of PCB using an anisotropic conductive film in accordance with a preferred embodiment of the present invention.

FIG. 4 is a schematic view of a method for manufacturing the connecting structure of PCB using the anisotropic conductive film in accordance with a preferred embodiment of the present invention.

FIG. 5 is a graph illustrating a surface roughness value of a member having dents.

BEST MODE FOR CARRYING OUT THE INVENTION

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

FIG. 3 is a cross-sectional view schematically illustrating a connecting structure of PCB using an anisotropic conductive film in accordance with a preferred embodiment of the present invention.

Referring to FIG. 3, the connecting structure of PCB using the anisotropic conductive film according to the present invention includes members 100 and 200 and the anisotropic conductive film 300 interposed between the members 100 and 200.

The anisotropic conductive film 300 includes an insulating adhesive 310 as a base material and conductive particles 320 dispersed in the insulating adhesive 310.

The insulating adhesive 310 firmly adheres to and fixes the members 100 and 200. And, the insulating adhesive 310 sustains insulation on an x-y plane of the anisotropic conductive film 300. That is, the insulating adhesive 310 separates the adjacent conductive particles 320 from each other and thus prevents the adjacent conductive particles 320 from contacting with each other, thereby preventing establishment of electrical connection on the x-y plane in the members 100 and 200 having fine wirings.

The insulating adhesive 310 includes a thermosetting resin, for example an epoxy resin and a penol resin, or a thermoplastic resin, for example polyester, polypropylene, polystyrene, their combined polymer resin and so on. However, the present invention is not limited in this regard, and various modified embodiments may be used within the objects of the present invention.

The conductive particles 320 electrically connect to electrodes 110 and 210 of the members 100 and 200. Preferably, the conductive particles 320 are made of at least any one metal selected from gold, silver, copper, nickel or their alloy.

Meanwhile, preferably the conductive particle 320 has a diameter of 1 to 15 μm sufficient to electrically connect to the members 100 and 200 having fine pitch wirings. However, the present invention is not limited in a specific numerical value, and may be variously modified according to characteristics of the members.

The electrodes 110 and 210 of the members 100 and 200 are arranged at predetermined intervals and connected to each other by the conductive particles 320 contined in the anisotropic conductive film 300.

At this time, preferably any one of the members 100 and 200 has a flexible property. For example, if a lower member 100 is PCB (printed circuit board), an upper member 200 uses FPC (flexible printed circuit). However, the present invention is not limited in this regard, and position and numbers of the members may be variously modified according to the objects of the present invention. For the convenience of description, assuming that the upper member 200 has a flexible property, the description is hereinafter made.

When heat-compressing the members 100 and 200, a concavo-convex structure (referred to as so-called dents) is generated on an upper surface of an upper member 200 due to a heat-compression process.

Specifically, during the compression process, the concavo-convex structure is formed on a surface of the upper member 200 opposite to an electrode forming surface due to pressure. Preferably, a surface roughness value calculated by measuring the height of the dents is 0.1 to 5.0 μm. More preferably, the surface roughness value is 0.3 to 5.0 μm. Further more preferably, the surface roughness value is 0.8 to 2.0 μm.

The dents formed on the upper member 200 serve as the standard for checking whether the electrodes 110 and 210 of the members 100 and 200 are precisely aligned and compressed. Thus, it easily checks a pressed state of the conductive particles 320 contained in the anisotropic conductive film 300 for electrically connecting to the electrodes 110 and 210 of the members 100 and 200, and a connection state of the members 100 and 200. If the surface roughness value of the upper member 200 is less than 0.1 μm, compression pressure, compression temperature and compression time are unsuitable, resulting in poor connection between the members 100 and 200 and increased contact resistance. And, if the surface roughness value of the upper member 200 is more than 5.0 μm, the conductive particles are destroyed or the upper member is damaged. The description thereof is made below through experimental examples.

Hereinafter, a method for manufacturing the connecting structure of PCB using the anisotropic conductive film in accordance with the present invention is described.

FIG. 4 is a schematic view of a manufacturing method in accordance with the present invention.

Referring to FIG. 4, first, the anisotropic conductive film 300 is attached to one surface of the first member 100 having the electrodes arranged at regular intervals. And, heat and pressure are applied to the anisotropic conductive film 300 so as to temporarily compress the first member 100 and the anisotropic conductive film 300 (See 'a' of FIG. 4). Subsequently, a cover film (not shown) is removed, which is formed on a surface of the anisotropic conductive film 300 opposite to the surface contacting the first member 100, and the second member 200 is attached to the surface where the cover film is removed (See 'b' of FIG. 4). Next, heat and pressure are applied to the anisotropic conductive film 300 through the second member 200 thereby to substantially compress the first member 100 and the second member 200 (See 'c' of FIG. 4). At this time, the second member 200 is a flexible printed circuit having a flexible property, and thus the dents are generated corresponding to patterns of the electrodes 210 during the compression process. That is, portions of the FPC 200 corresponding to the electrodes 210 form convex portions 220 by pressure, and portions between the adjacent electrodes 210 form concave portions 230 relatively dented than the convex portions 220.

As such, pressure applied to the members 100 and 200 during curing the anisotropic conductive film 300 remains as stress, and thus the dents are generated on the surface of the second member 200. Therefore, difference in height between the convex portions 220 and the concave portions 230 formed on the surface of the second member 200 is measured using a separate surface roughness tester (See FIG. 5), and thus the connection state of the members 100 and 200 is indirectly checked. The surface roughness value may be measured by naked eyes as well as using the surface roughness tester.

<Relation Between Surface Roughness and Compression Pressure>

If compression pressure is less than 2 MPa in the compression process, there is a small difference in height between the convex portions 220 formed corresponding to the electrodes 210 and the concave portions 230 formed between the adjacent electrodes 210. And, if compression pressure is more than 2 MPa in the compression process, the electrodes 210 are damaged by high pressure, and thus the concave portions 220 formed corresponding to the electrodes 210 are destroyed and the dents are formed irregularly. Therefore, assuming that compression temperature and compression time are normal, if compression pressure is excessively small, it may be determined that, when the members 100 and 200 are connected to each other using the anisotropic conductive film 300, the conductive particles 320 are incompletely pressed and thus the connection is unstable, and if compression pressure is excessively large, it may be determined that the conductive particles 320 are crushed and thus the connection is faulty.

<Relation Between Surface Roughness and Compression Temperature>

If compression temperature is less than 120° C. in the compression process, the anisotropic conductive film 300 is incompletely cured, and thus, after pressure is removed, the anisotropic conductive film 300 is restored to an original shape and the dents disappear. And, if compression temperature is more than 220° C., voids are generated in the anisotropic conductive film 300 due to thermal decomposition, thereby resulting in irregular dents. Therefore, assuming that compression pressure and compression time are normal, if the dents are not generated, it may be determined that compression temperature is low, thereby resulting in incomplete connection between the electrodes 110 and 210 of the members 100 and 200, and if the dents are irregularly formed, it may be determined that compression temperature is excessively high and thus voids are generated, resulting in faulty connection between the electrodes 110 and 210 of the members 100 and 200.

<Relation Between Surface Roughness and Compression Time>

If compression time is shorter than 3 seconds in the compression process, portions of the FPC 200 between the adjacent electrodes 210 are incompletely modified, and thus difference in height between the convex portions 220 and the concave portions 230 is small. And, if compression time is longer than 30 seconds, the portions of the FPC 200 between the adjacent electrodes 210 are excessively modified, and thus difference in height between the convex portions 220 and the concave portions 230 becomes large. Therefore, assuming that compression pressure and compression temeprature are normal, if the dents are not generated, it may be determined that compression time is short, thereby resulting in incomplete connection between the electrodes 110 and 210 of the members 100 and 200, and if the dents are irregularly formed, it may be determined that compression time is long, thereby resulting in faulty connection between the electrodes 110 and 210 of the members 100 and 200.

Hereinafter, by referring to more concrete experimental examples of the present invention, the present invention is described in detail. However, the present invention is not limited to the below experimental examples, and various embodiments may be incorporated within the accompanying claims.

The experimental examples interposes an anisotropic conductive film including conductive particles containing nickel powder having a diameter of 5 μm, between the PCB and the FPC, applies temperature and pressure under various conditions to execute a heat-compression process, and measures the dents formed on the FPC using a surface roughness tester thereby to express concretely the roughness range of the dents corresponding to good connection state.

Experimental Example 1

After the anisotropic conductive film made of an epoxy resin is attached to the PCB having the width of the electrode of 200 μm, the interval between the adjacent electrodes of 150 μm, and the pitch between the electrodes of 350 μm, pressure of 1.5 MPa is applied at 80° C. during 2 seconds for temporary compression. Then, after the cover film of the anisotropic conductive film is removed, the FPC is arranged such that the electrodes of the PCB are aligned with the electrodes of the FPC. Next, pressure of 3 MPa is applied at 180° C. during 20 seconds for substantial compression. Subsequently, the surface roughness value of one surface of the FPC is measured using the surface roughness tester, and the contact resistance between the electrodes of the PCB and the FPC is measured.

Experimental Example 2

After the anisotropic conductive film made of an acryl resin is attached to the PCB having the width of the electrode of 200 μm, the interval between the adjacent electrodes of 150 μm, and the pitch between the electrodes of 350 μm, pressure of 1.5 MPa is applied at 80° C. during 2 seconds for temporary compression. Then, after the cover film of the anisotropic conductive film is removed, the FPC is arranged such that the electrodes of the PCB are aligned with the electrodes of the FPC. Next, pressure of 3 MPa is applied at 180° C. during 10 seconds for substantial compression. Subsequently, the surface roughness value of one surface of the FPC is measured using the surface roughness tester, and the contact resistance between the electrodes of the PCB and the FPC is measured.

Experimental Example 3

After the anisotropic conductive film made of an epoxy resin is attached to the PCB having the width of the electrode of 230 μm, the interval between the adjacent electrodes of 220 μm, and the pitch between the electrodes of 450 μm, pressure of 1.5 MPa is applied at 80° C. during 2 seconds for temporary compression. Then, after the cover film of the anisotropic conductive film is removed, the FPC is arranged such that the electrodes of the PCB are aligned with the electrodes of the FPC. Next, pressure of 3 MPa is applied at 180° C. during 20 seconds for substantial compression. Subsequently, the surface roughness value of one surface of the FPC is measured using the surface roughness tester, and the contact resistance between the electrodes of the PCB and the FPC is measured.

Experimental Example 4

After the anisotropic conductive film made of an acryl resin is attached to the PCB having the width of the electrode of 230 μm, the interval between the adjacent electrodes of 220 μm, and the pitch between the electrodes of 450 μm, pressure of 1.5 MPa is applied at 80° C. during 2 seconds for temporary compression. Then, after the cover film of the anisotropic conductive film is removed, the FPC is arranged such that the electrodes of the PCB are aligned with the electrodes of the FPC. Next, pressure of 3 MPa is applied at 180° C. during 10 seconds for substantial compression. Subsequently, the surface roughness value of one surface of the FPC is measured using the surface roughness tester, and the contact resistance between the electrodes of the PCB and the FPC is measured.

Experimental Example 5

After the anisotropic conductive film made of an epoxy resin is attached to the PCB having the width of the electrode of 200 μm, the interval between the adjacent electrodes of 150 μm, and the pitch between the electrodes of 350 μm, pressure of 1.5 MPa is applied at 80° C. during 2 seconds for temporary compression. Then, after the cover film of the anisotropic conductive film is removed, the FPC is arranged such that the electrodes of the PCB are aligned with the electrodes of the FPC. Next, pressure of 2 MPa is applied at 180° C. during 20 seconds for substantial compression. Subsequently, the surface roughness value of one surface of the FPC is measured using the surface roughness tester, and the contact resistance between the electrodes of the PCB and the FPC is measured.

Experimental Example 6

After the anisotropic conductive film made of an acryl resin is attached to the PCB having the width of the electrode of 200 μm, the interval between the adjacent electrodes of 150 μm, and the pitch between the electrodes of 350 μm, pressure of 1.5 MPa is applied at 80° C. during 2 seconds for temporary compression. Then, after the cover film of the anisotropic conductive film is removed, the FPC is arranged such that the electrodes of the printed circuit board are aligned with the electrodes of the FPC. Next, pressure of 2 MPa is applied at 180° C. during 10 seconds for substantial compression. Subsequently, the surface roughness value of one surface of the FPC is measured using the surface roughness tester, and the contact resistance between the electrodes of the PCB and the FPC is measured.

The below table 1 shows the surface roughness value of the FPC and the contact resistance value between the electrodes of the PCB and the FPC, measured according to the above experimental examples.

TABLE 1

| | | | | Compression conditions | | | | |
|---|---|---|---|---|---|---|---|---|
| | Kind of insulating adhesive | Width of electrode (μm) | Interval between electrodes (μm) | Temporary compression temperature/ substantial compression temperture | Temporary compression pressure/ substantial compression pressure | Temporary compression time/substantial compression pression time (sec) | Roughness (Ra/μm) | Resistance between electrodes (Ω) |
| Experimental example 1 | Epoxy resin | 200 | 150 | 80/180 | 1.5/3 | 2/20 | 0.8 | 1.2 |
| Experimental example 2 | Acryl resin | 200 | 150 | 80/180 | 1.5/3 | 2/10 | 0.6 | 1.5 |
| Experimental example 3 | Epoxy resin | 230 | 220 | 80/180 | 1.5/3 | 2/20 | 1.5 | 1.5 |
| Experimental example 4 | Acryl resin | 230 | 220 | 80/180 | 1.5/3 | 2/10 | 1.3 | 1.5 |
| Experimental example 5 | Epoxy resin | 200 | 150 | 80/180 | 1.5/2 | 2/20 | 0.3 | 2.5 |
| Experimental example 6 | Acryl resin | 200 | 150 | 80/180 | 1.5/2 | 2/10 | 0.2 | 3.2 |

Referring to Table 1, compared the experimental example 1 with the experimental example 2, the experimental example 3 with the experimental example 4, and the experimental example 5 with the experimental example 6, when an acryl resin is used as the insulating adhesive of the anisotropic conductive film, the acryl resin has faster curing rate than the epoxy resin, and thus the acryl resin tends to be cured before the conductive particles are sufficiently compressed, and accordingly difference in height of the concavo-convex structure is not great (i.e. the surface roughness value is relatively small), and the contact resistance between the electrodes of the PCB and the FPC is relatively larger than that of the epoxy resin.

And, compared the experimental example 1 with the experimental example 5, when pressure of 3 Mpa and 2 Mpa is respectively applied in the substantial compression process, the surface roughness value is 0.8 μm and 0.3 μm, respectively, and therefore, in the case of the experimental example 5 performed under lower pressure, the conductive particles are incompletely pressed, and thus the resistance between electrodes of the FPC is relatively larger.

And, compared the experimental example 1 with the experimental example 3, when the electrode pitches are 350 µm and 450 µm, respectively, the surface roughness values are 0.8 µm and 1.5 µm, respectively, and therefore, in the case that the electrode pitch is relatively larger, if the conductive particles are excessively compressed, the surface roughness is not uniform and the contact resistance between the electrodes of the PCB and the FPC is large.

Through the experimental result, it is noted that the surface roughness of the dents is closely related to the electrical connection state of the members, and when the surface roughness of the dents satisfies the numerical range of the present invention, the electrical connection state of the members is good.

Hereinabove, preferred embodiments of the present invention has been described in detail with reference to the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

INDUSTRIAL APPLICABILITY

The connecting structure of PCB using the anisotropic conductive film according to the present invention may easily check the interconnection state of the members without an additional inspection step. Accordingly, the present invention may provide stability to a member connecting process and improve reliability of products.

The invention claimed is:

1. A method for adhering to a pair of members, the method comprising:
   (a) arranging an anisotropic conductive film including an insulating adhesive and conductive particles dispersed in the insulating adhesive, on one surface of a first member;
   (b) applying predetermined heat and pressure to heat-compress the anisotropic conductive film to the first member;
   (c) arranging a second member having a flexible property on a surface of the anisotropic conductive film opposite to the surface to which the first member is adhered; and
   (d) applying predetermined heat and pressure to heat-compress the anisotropic conductive film to the second member,
   wherein the step (d) includes controlling compression pressure, temperature and time such that a surface roughness value of dents formed on the surface of the second member is in the range of 0.1 to 5.0 µm.

2. The method for adhering to a pair of members of claim 1, wherein, in the step (d), the compression pressure is 2 MPa to 12 MPa.

3. The method for adhering to a pair of members of claim 1, wherein, in the step (d), the compression temperature is in the range of 120° C. to 220° C.

4. The method for adhering to a pair of members of claim 1, herein, in the step (d), the compression time is in the range of 3 to 30 seconds.

* * * * *